(12) United States Patent
Ratnakumar et al.

(10) Patent No.: US 9,455,338 B1
(45) Date of Patent: Sep. 27, 2016

(54) METHODS FOR FABRICATING PNP BIPOLAR JUNCTION TRANSISTORS

(71) Applicant: Altera Corporation, San Jose, CA (US)

(72) Inventors: Albert Ratnakumar, San Jose, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 189 days.

(21) Appl. No.: 13/715,470

(22) Filed: Dec. 14, 2012

(51) Int. Cl.
*H01L 29/66* (2006.01)
*H01L 21/336* (2006.01)
*H01L 29/735* (2006.01)

(52) U.S. Cl.
CPC ......... *H01L 29/735* (2013.01); *H01L 29/6625* (2013.01)

(58) Field of Classification Search
CPC .............. H01L 29/66234; H01L 29/66931; H01L 2924/1305; H01L 29/73; H01L 29/7322; H01L 29/7325
USPC ........... 438/297, 203, 318, 312, 339, 309; 257/140, 587, 589, 370, 565.592, 173, 257/591, 131, 588, 402, 133
See application file for complete search history.

(56) References Cited

U.S. PATENT DOCUMENTS

| | | | |
|---|---|---|---|
| 5,352,912 A * | 10/1994 | Crabbe | H01L 29/737 257/191 |
| 6,274,892 B1 * | 8/2001 | Kub et al. | 257/131 |
| 6,407,414 B1 * | 6/2002 | Yu | 257/173 |
| 6,972,466 B1 | 12/2005 | Liang et al. | |
| 8,264,214 B1 | 9/2012 | Ratnakumar et al. | |
| 2001/0013610 A1 | 8/2001 | Chi et al. | |
| 2004/0110353 A1 * | 6/2004 | Mallikarjunaswamy | H01L 21/8249 438/309 |
| 2004/0253779 A1 * | 12/2004 | Hong | H01L 21/8249 438/203 |
| 2007/0235757 A1 * | 10/2007 | Agarwal et al. | 257/187 |
| 2009/0127629 A1 | 5/2009 | Shafi | |
| 2012/0032303 A1 * | 2/2012 | Elkareh et al. | 257/587 |
| 2012/0112240 A1 * | 5/2012 | Takeda et al. | 257/133 |
| 2012/0119331 A1 * | 5/2012 | Gendron et al. | 257/587 |
| 2012/0205714 A1 | 8/2012 | Salcedo et al. | |
| 2013/0277805 A1 * | 10/2013 | Hung | H01L 29/6625 257/588 |

FOREIGN PATENT DOCUMENTS

EP 1048078 11/2000

* cited by examiner

*Primary Examiner* — Selim Ahmed
*Assistant Examiner* — Moin Rahman
(74) *Attorney, Agent, or Firm* — Treyz Law Group, P.C.; Jason Tsai

(57) ABSTRACT

Integrated circuits with bipolar transistors are provided. In one embodiment, a bipolar transistor may include an emitter region, a first base region that surrounds the emitter region, a collector region that surrounds the first base region, and a second base region that surrounds the collector region. Respective well taps may be formed within the emitter, collector, and the second base regions. A deep doped well having the same doping type as the base regions may extend beneath the emitter, collector, and base regions. In another embodiment, the bipolar transistor may include an emitter region, a base region that surrounds the emitter region, and a collector region that surrounds the base region. Respective well taps may be formed within the emitter, base, and collector regions. A deep doped well having the same doping type as the base region may extend beneath the emitter and only a portion of the base region.

17 Claims, 6 Drawing Sheets

METHODS FOR FABRICATING PNP BIPOLAR JUNCTION TRANSISTORS

BACKGROUND

This invention relates to bipolar transistors and, more particularly, to methods for fabricating bipolar transistors.

Integrated circuits based on complementary metal-oxide-semiconductor (CMOS) transistors contain complementary n-channel and p-channel metal-oxide-semiconductor (MOS) field-effect transistors. CMOS technology allows circuits to be formed that exhibit low power consumption and high levels of integration.

It is sometimes desirable to form another type of transistor such as the bipolar junction transistor (BJT) on the same silicon substrate as the MOS transistors on a CMOS integrated circuit. Bipolar junction transistors can be used to form circuits that are difficult or impractical to form using MOS transistors. Bipolar transistors have three terminals—an emitter terminal, a collector terminal, and a base terminal. Current passes between the emitter and collector under the control of signals applied to the base.

One way of forming a PNP bipolar transistor involves forming an N-well that is connected to the base terminal, a P+ region in the N-well that is connected to the emitter terminal, and a P-well that is adjacent to the N-well and that is connected to the collector terminal. The P+ emitter region may be epitaxially grown in a trench etched within the N-well by selectively depositing silicon germanium material in the trench (i.e., silicon germanium material is grown in direct contact with the N-well). This type of junction in which P+ silicon germanium is grown in direct contact with the N-well is sometimes referred to as a "hetero" junction.

The current that passes from the emitter to the collector in a PNP bipolar transistor may vary exponentially with the voltage difference across the emitter and the base ($V_{BE}$). It is therefore generally desirable for $V_{BE}$ to be relatively constant during normal operation of the bipolar transistor so as to draw a constant amount of current. The formation of hetero junctions in bipolar transistors may, however, result in substantial $V_{BE}$ variation and can significantly degrade device performance and reliability.

SUMMARY

This relates generally to integrated circuits, and more particularly, to integrated circuits with bipolar junction transistors.

Integrated circuits may include bipolar junction transistors (BJTs) formed in a semiconductor substrate. A bipolar transistor may include an emitter well region, a base well region, and a collector well region. The bipolar transistor may be a PNP bipolar transistor (e.g., the bipolar transistor may have a P-type emitter, an N-type base, and a P-type collector). The base well region may be interposed between the emitter well region and the collector well region. In some embodiments, the base region may be a ring-shaped well region that laterally surrounds the emitter region while the collector region may be a ring-shaped well region that laterally surrounds the base region.

An emitter well tap may be formed within the emitter well region via epitaxy (otherwise known as in situ doping). The emitter well tap may have a dopant concentration that is substantially greater than that of the emitter well region in which it is formed.

A deep doped well region may be formed directly beneath the emitter well region. The deep doped well may have the same doping type as that of the base well region (e.g., the deep doped well and the base well region may both be formed using N-type dopants). In one suitable arrangement, the deep doped well may extend only partially beneath the base well region (i.e., the deep doped well overlaps only partly with the base well region and does not overlap with the collector well region). In another suitable arrangement, the deep doped well may extend beneath the base well region and the collector well region.

Further features of the present invention, its nature and various advantages will be more apparent from the accompanying drawings and the following detailed description.

DETAILED DESCRIPTION

Embodiments of the present invention relate to integrated circuits having complementary metal-oxide-semiconductor (CMOS) field-effect transistors and bipolar junction transistors (BJTs). The invention also relates to methods for fabricating such integrated circuits.

It is often desirable to form bipolar transistors on a CMOS integrated circuit. Bipolar transistor structures can be used to form silicon-controlled rectifiers (SCRs) for electrostatic discharge (ESD) protection circuits. Bipolar transistor structures can also be used in temperature-invariant voltage reference circuits and as part of integrated bipolar-CMOS (BiCMOS) designs.

Figure 1:
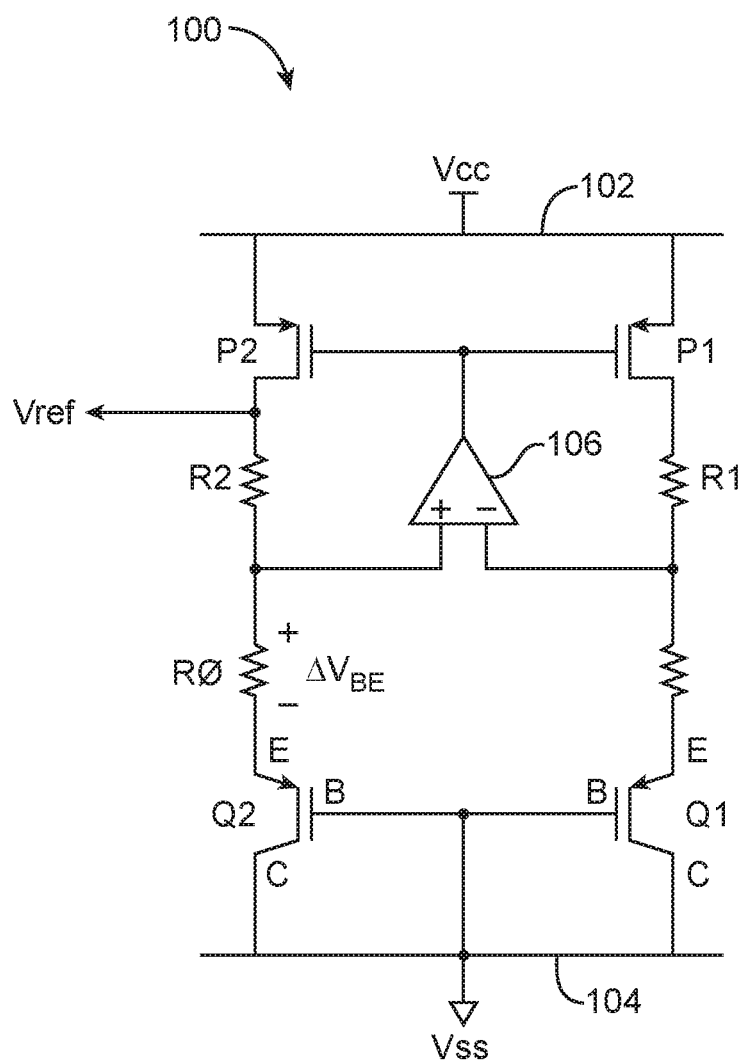
FIG. 1 is a circuit diagram of an illustrative bandgap voltage reference circuit in accordance with an embodiment of the present invention.

Voltage reference circuits are commonly used in integrated circuit designs where a stable voltage of a known magnitude is required. For example, some integrated circuits have power supply circuitry in which the magnitude of the power supply voltage that is produced by the power supply circuitry is regulated using a bandgap voltage reference circuit. Bandgap voltage reference circuits may be implemented using bipolar transistors. FIG. 1 shows one suitable arrangement of a bandgap voltage reference circuit 100 that can be used to generate a temperature-independent reference voltage.

As shown in FIG. 1, circuit 100 may include a first PNP bipolar transistor Q1, a second PNP bipolar transistor Q2, resistors R0, R1, and R2, a first p-channel CMOS transistor P1, a second p-channel CMOS transistor P2, and an operational amplifier 106. Transistor Q1, resistor R1, and transistor P1 may be coupled in series between a positive power supply line 102 (e.g., a power supply line on which a positive power supply voltage Vcc is provided) and a ground power supply line 104 (e.g., a power supply line on which a ground power supply voltage Vss is provided). In particular, bipolar transistor Q1 may have collector and base terminals that are coupled to ground line 104 and an emitter terminal. Resistor R1 may have a first terminal that is coupled to the emitter of transistor Q1 and a second terminal. Transistor P1 may have a drain terminal that is coupled to the second terminal of resistor R1, a source terminal that is coupled to power supply line 102, and a gate terminal.

Transistor Q2, resistors R0 and R2, and transistor P2 may also be coupled in series between power supply lines 102 and 104. In particular, bipolar transistor Q2 may have collector and base terminals that are coupled to ground line 104 and an emitter terminal. Resistor R0 may have a first terminal that is coupled to the emitter of transistor Q2 and a second terminal. Transistor P2 may have a drain terminal that is coupled to the second terminal of resistor R0 via resistor R2, a source terminal that is coupled to power supply line 102, and a gate terminal. The drain terminal of transistor P2 may be coupled to an output of circuit 100 (e.g., an output on which temperature-invariant reference voltage Vref is provided). Amplifier 106 may have a first (positive) input that is coupled to the second terminal of resistor R0, a second (negative) input that is coupled to the emitter of bipolar transistor Q1, and an output that is coupled to the gate terminals of p-channel transistors P1 and P2.

The voltage at the negative input of amplifier 106 (and the second terminal of resistor R0) may be set to $V_{BE1}$ (i.e., the voltage difference between the emitter and the base of bipolar transistor Q1). Amplifier 106 may force the positive input of amplifier 106 to be at voltage level $V_{BE1}$. The voltage at the first terminal of resistor R0 may be equal to $V_{BE2}$ (i.e., the voltage difference between the emitter and the base of bipolar transistor Q2). The voltage drop across resistor R0 may therefore be equal to the difference between $V_{BE1}$ and $V_{BE2}$ (indicated as $\Delta V_{BE}$ in FIG. 1). Connected using the current-mirror configuration of FIG. 1, $\Delta V_{BE}$ may be proportional to the transistor sizing ratio of Q2 to Q1 (which is a predetermined fixed ratio) and a thermal voltage associated with bipolar transistors. The thermal voltage is typically directly proportional to temperature (e.g., a rise in temperature will result in a rise in $\Delta V_{BE}$ and vice versa).

Transistor Q2 may sink a given amount of current that also runs through resistor R0. The given amount of current may be calculated as $\Delta V_{BE}$ divided by the resistance of R0 (according to Ohm's law). Bandgap output voltage Vref may be calculated as the sum of $V_{BE1}$ (as set using amplifier 106) and the voltage difference across resistor R2. The voltage difference across resistor R2 may be equal to the product of the given amount of current and the resistance of R2. In other words, Vref is proportional to $V_{BE1}$ and the given amount of current (which is proportional to $\Delta V_{BE}$). Since $V_{BE1}$ is typically inversely proportional to temperature (e.g., a rise in temperature will result in a decrease in $V_{BE1}$ and vice versa) whereas $\Delta V_{BE}$ is directly proportional to temperature (as described above), the overall net effect is that Vref exhibits a relatively stable voltage level across different temperatures.

The example of FIG. 1 in which bipolar junction transistors such as PNP transistors are used in a bandgap reference circuit 100 is merely illustrative and does not serve to limit the scope of the present invention. If desired, PNP transistors may be used in any suitable integrated circuit. For example, PNP and/or NPN bipolar transistors may be formed in a programmable integrated circuit such as a programmable integrated circuit, an application-specific integrated circuit (ASIC), a digital signal processing circuit, a microprocessor, a memory chip, an audio or video integrated circuit, or any other suitable integrated circuit.

Figure 2:
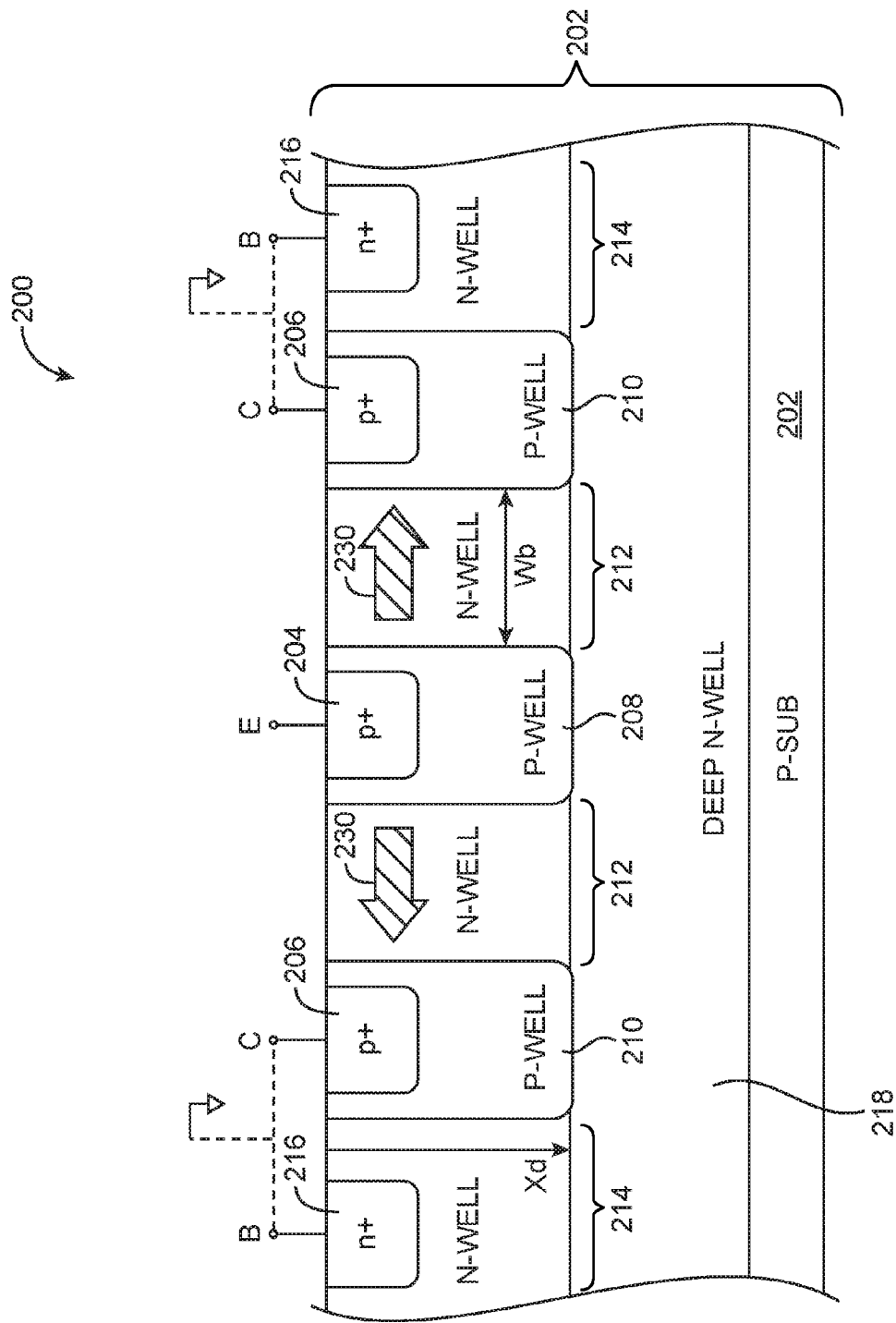
FIG. 2 is a cross-sectional side view of an illustrative lateral PNP bipolar transistor in accordance with an embodiment of the present invention.

FIG. 2 is a cross-sectional side view of one suitable arrangement of a PNP bipolar transistor 200. As shown in FIG. 2, transistor 200 includes a first P-well region 208, a first N-well region 212 that surrounds region 208, a second P-well region 210 that surrounds region 212, and a second N-well region 214 that surrounds region 210, where regions 208, 20, 212, and 214 are formed in a P-type semiconductor substrate 202. Substrate 202 may be lightly doped using P-type dopants (e.g., boron) with dopant concentrations of no more than $10^{14}$ dopant atoms/cm$^3$ and may therefore sometimes be referred to as a P-type substrate (PSUB). Regions of substrate 202 with such low dopant concentrations may be referred to as "native" or substantially undoped substrate regions.

Regions 210, 212, and 214 may be circular or rectangular ring-shaped regions (as an example). In particular, P-well region 208 may be coupled to an emitter (E) terminal of transistor 200 via a P+ region 204 formed within region 208, P-well region 210 may be coupled to a collector (C) terminal of transistor 200 via a P+ region 206 formed within region 210, and N-well region 214 may be coupled to a base (B) terminal of transistor 200 via an N+ region 216 formed within region 214. In the example of FIG. 2, the base and collector terminals of transistor 200 are coupled to the ground line. This is merely illustrative. If desired, the base, collector, and emitter terminals of transistor 200 may receive any desired voltage level for placing transistor 200 in any suitable mode of operation.

A deep doped well region such as a deep N-well (DNW) region 218 may be formed at a depth Xd directly beneath regions 208, 210, 212, and 214 (e.g., DNW 218 may extend under regions 208, 210, 212, and 214). Emitter well region 208 and DNW region 218 may have opposite doping types (e.g., region 208 may be doped using P-type dopants, whereas region 218 may be doped using N-type dopants). Depth Xd may, for example, be equal to 0.7 microns. Deep N-well region 218 may serve to electrically isolate the emitter region 209 from the collector region 210 and may also serve to electrically short regions 212 and 214 so that signals applied at the base terminal B can control the electrical behavior of N-well region 212 (e.g., regions 212, 214, and 218 all have the same N-type doping).

Deep N-well 218 may be formed using deep dopant implant techniques. For example, N-type dopants (e.g., phosphorous, arsenic, etc.) may be implanted deep within substrate 202 below depth Xd to form deep N-well region 218 with a concentration of up to $10^{16}$ dopant atoms/cm$^3$ (as an example). N-well regions 212 and 214 may be formed using normal dopant implant techniques (i.e., for implanting dopants in the substrate relatively shallower than the deep dopant implant). For example, N-type dopants may be implanted such that selected regions in substrate 202 (i.e., regions 212 and 214) from a top surface of substrate 202 to depth Xd below the top surface of substrate 202 are doped with a concentration of up to $10^{17}$ dopant atoms/cm$^3$ (as an example). Region 216 (sometimes referred to as a well tap region or well tap) may have a relatively high N-type dopant concentration of up to $10^{19}$ atoms/cm$^3$.

P-well regions 208 and 210 may also be formed using normal dopant implant techniques. For example, P-type dopants may be implanted such that selected regions in substrate 202 (i.e., regions 208 and 210) from a top surface of substrate 202 to depth Xd below the top surface of substrate 202 are doped with a concentration of up to $10^{17}$ dopant atoms/cm$^3$ (as an example). Well taps 204 and 206 may have a relatively high P-type dopant concentration of up to $10^{19}$ atoms/cm$^3$ and may be formed via epitaxial growth (e.g., via chemical vapor deposition, vapor-phase epitaxy, molecular-beam epitaxy, liquid-phase epitaxy, etc.) of material such as silicon germanium, a process otherwise known as "in situ" doping.

Transistor 200 of FIG. 2 in which DNW 218 completely covers both emitter region 208 and collector region 210 from below may pass a current that primarily flows laterally from the emitter to the collector through N-well region 212, as indicated by arrows 230. Transistor 200 may therefore sometimes be referred to as a "lateral" PNP bipolar transistor. Transistor 200 operated in this way may therefore have an effective base width Wb that is equal to the width of N-well region 212 (see, FIG. 2). Base width Wb may be equal to 0.216 microns (as an example). As described previously, base region 212 may be biased via well tap 216 formed outside of region 212 (e.g., in region 214). Arranged in this way, base width Wb can be reduced to provide an improvement in the Beta factor of BJT 200. An improved Beta factor β may result in a performance improvement for transistor 200. Moreover, forming P-type tap region 204 (sometimes referred to as "PTAP") within emitter region 208 can help to minimize $V_{BE}$ variation.

Figure 3:
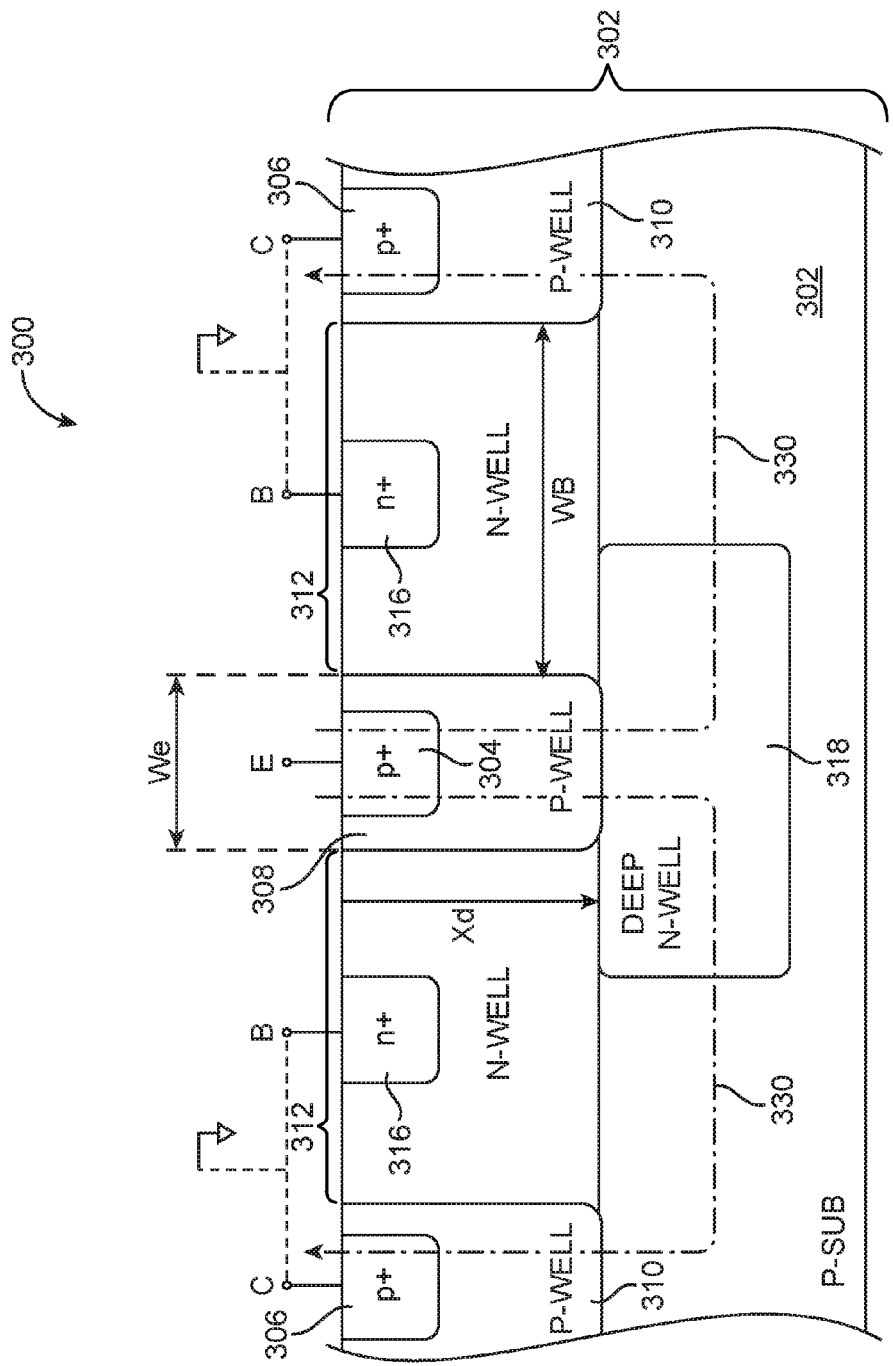
FIG. 3 is a cross-sectional side view of an illustrative vertical PNP bipolar transistor in accordance with an embodiment of the present invention.

The transistor arrangement of FIG. 2 may potentially exhibit process variations at the interface between well regions 208 and 212 and between well regions 210 and 212 (see, dotted lines associated with base width Wb). This variation in Wb may be a result of mask misalignment when performing selective doping for well 208, 210, or 212. FIG. 3 shows another suitable arrangement of a PNP bipolar junction transistor 300 that exhibits improved tolerance to mask misalignment issues.

As shown in the cross-sectional view of FIG. 3, transistor 300 includes a first P-well region 308, an N-well region 312 that is adjacent to region 308 and surrounds region 308, and a second P-well region 310 that is adjacent to region 312 and surrounds region 312, where region 308, 310, and 312 are formed in P-type semiconductor substrate 302. Substrate (PSUB) 302 may be lightly doped using P-type dopants with dopant concentrations of no more than $10^{15}$ dopant atoms/cm$^3$ (as an example).

Regions 310 and 312 may be circular or rectangular ring-shaped regions (as an example). In particular, P-well region 308 may be coupled to an emitter (E) terminal of transistor 300 via a P+ well tap 304 formed within region 308, P-well region 310 may be coupled to a collector (C) terminal of transistor 300 via a P+ well tap 306 formed within region 310, and N-well region 312 may be coupled to a base (B) terminal of transistor 300 via an N+ well tap 316 formed within region 314. In the example of FIG. 3, the base and collector terminals of transistor 300 are coupled to the ground line. This is merely illustrative. If desired, the base, collector, and emitter terminals of transistor 300 may receive any desired voltage level for placing transistor 300 in any suitable mode of operation.

A deep N-well (DNW) region 318 may be formed at a depth Xd below the surface of substrate 302 and may overlap completely with region 308 and may overlap with only a portion of N-well regions 312 (e.g., DNW 318 and N-well 312 may surround P-well region 308 from the bottom and from the sides, respectively). Deep N-well region 318 does not isolate collector P-well region 310 from P-type substrate material 302 (e.g., DNW region 318 does not extend under region 310). In other words, collector region 310 may be at least electrically connected to substrate 302 in the vicinity of DNW region 318.

Deep N-well 318 may be formed using deep dopant implant techniques. For example, N-type dopants may be implanted deep within substrate 302 below depth Xd to form deep N-well region 318 with a concentration of up to $10^{17}$ dopant atoms/cm$^3$ (as an example). N-well region 312 may be formed using normal dopant implant techniques (or relatively shallow implant techniques compared to the deep dopant implantation). For example, N-type dopants may be implanted such that selected regions in substrate 302 (i.e., region 312) from the top surface of substrate 302 to depth Xd below the top surface of substrate 302 are doped with a concentration of up to $10^{17}$ dopant atoms/cm$^3$ (as an example). Well tap 316 may have a relatively high N-type dopant concentration of up to $10^{19}$ atoms/cm$^3$.

P-well regions 308 and 310 may also be formed using normal dopant implant techniques. For example, P-type dopants may be implanted such that selected regions in substrate 302 (i.e., regions 308 and 310) from a top surface of substrate 202 to depth Xd below the top surface of substrate 202 are doped with a concentration of up to $10^{17}$ dopant atoms/cm$^3$ (as an example). Well taps 304 and 306 may have a relatively high P-type dopant concentration of up to $10^{19}$ atoms/cm$^3$ and may be formed via in situ doping with silicon germanium (as an example).

Transistor 300 of FIG. 3 in which DNW 318 only isolates P-well region 304 but not P-well region 310 from P-type substrate 302 may pass a current that primarily flows vertically from the emitter to the collector through DNW region 318 and P-type substrate 302, as indicated by current path 330. The cross-sectional side view of transistor 300 in FIG. 3 is not drawn to scale. As an example, emitter region 308 may have a depth Xd that is equal to 0.7 microns and a width We that is equal to 10 microns. Emitter region 308 may therefore have a lateral (sidewall) surface area that is substantially smaller than its base (bottom) surface area. Therefore, current flow will be dominated by carriers flowing through the bottom surface through DNW 318 and substrate 302 into collector region 310 (as indicated by carrier path 330). Transistor 300 operated in this way may therefore sometimes be referred to as a "vertical" PNP bipolar transistor. As with the arrangement of FIG. 2, forming emitter P+ region 304 within P-well region 308 can help to minimize $V_{BE}$ variation.

N-well base region 312 that is interposed between emitter region 308 and collector region 306 and that includes well tap 316 may have a base width WB that is substantially larger than the base width Wb of lateral PNP transistor 200 of the type described in connection with FIG. 2. Transistor 300 of FIG. 3 may have a base width WB that is greater than 1.5 microns (as an example). Transistor 300 may also experience process variations at the interface between well regions 308 and 312 and between well regions 310 and 312 (see, dotted lines associated with base width WB) due to mask misalignment issues during well doping operations. Variation in base width WB, however, can be tolerated since current flow is dominated by carriers flowing vertically through the bottom surface of P-well 308 rather than laterally through base region 312.

Figure 4A:
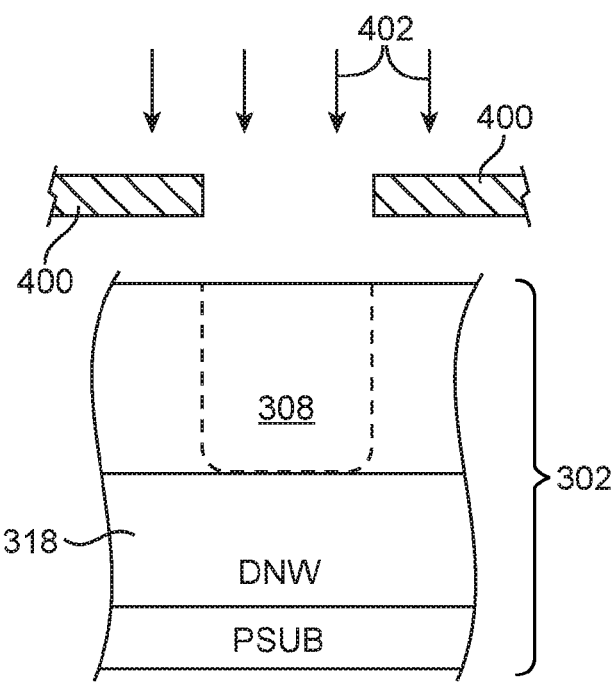
FIGS. 4A, 4B, 4C, and 4D are diagrams showing different snapshots in time during formation of a PNP bipolar transistor in accordance with an embodiment of the present invention.

FIGS. 4A-4D illustrates an exemplary process of forming a P-type emitter region for a PNP bipolar transistor. FIG. 4A shows a partial cross-sectional side view of a P-type substrate (PSUB) 302 that includes a deep N-well region 318. As shown in FIG. 4A, P-type dopants 402 may be selectively implanted using mask 400 to form P-well 308. Mask 400 may be part of an existing mask layer that is used in forming the P-type well regions for n-channel CMOS transistors on an integrated circuit (e.g., mask 400 may be part of the same mask that is used to form P-wells for PMOS transistors). Utilizing an existing CMOS mask layer when forming a BJT reduces manufacturing costs.

Figure 4B:
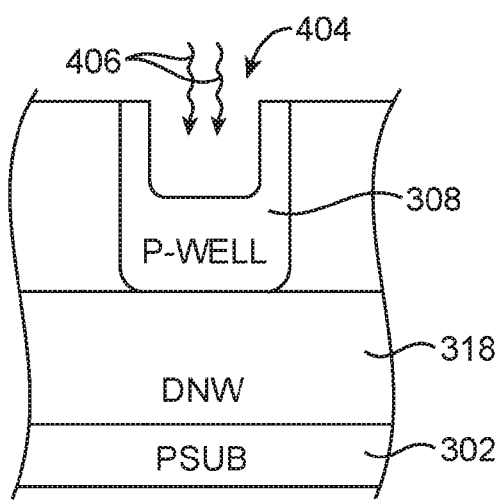

FIG. 4B shows an etching operation in which etchants 406 are used to selectively etch a well opening (or cavity) 404 within region 308. Any suitable etching techniques (e.g., dry etch, wet etch, etc.) can be used.

Figure 4C:
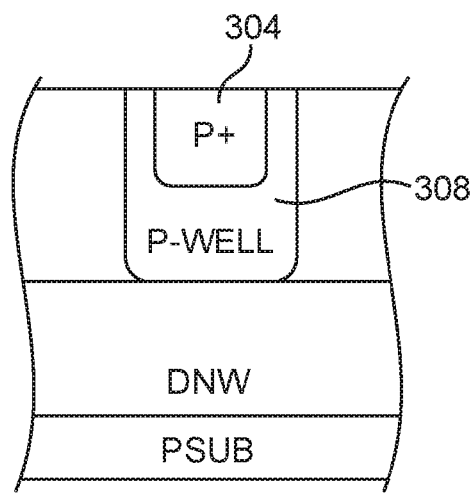

Following the etching operation of FIG. 4B, P+ material such as P+ doped silicon germanium or other suitable P+ doped material may be epitaxially grown within cavity 404 to form P+ region 304 (see, e.g., FIG. 4C).

Figure 4D:
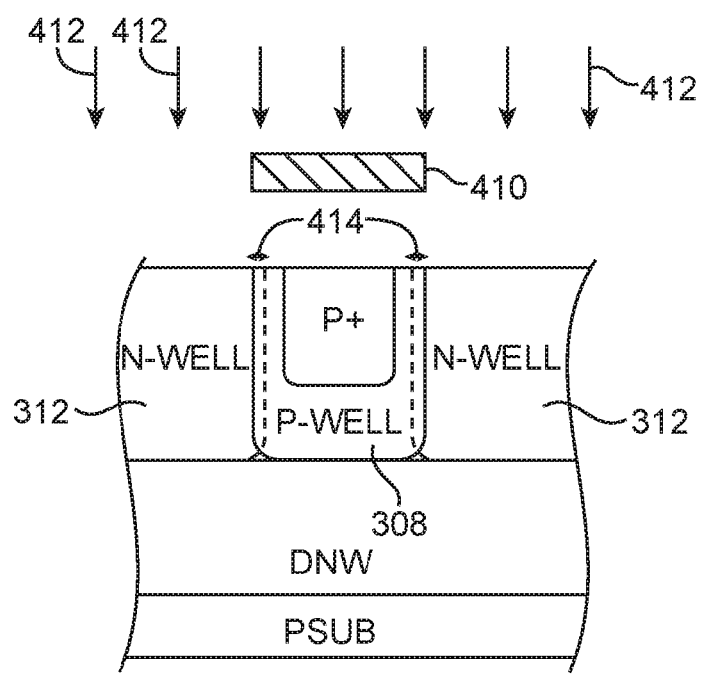

Following the in situ doping operation of FIG. 4C, N-type dopants 412 may be selectively implanted using mask 410 to form at least N-well 312 (see, e.g., FIG. 4D). Mask 410 may be part of an existing mask layer that is used in forming the N-type well regions for p-channel CMOS transistors on that integrated circuit (e.g., mask 410 may be part of the same mask that is used to form N-wells for NMOS transistors). Utilizing an existing CMOS mask layer when forming a BJT reduces manufacturing costs. As shown in FIG. 4D, mask misalignment issues may arise when masks 400 and 410 are horizontally offset with respect to each other, as indicated by well sidewall variation 414. The process shown in FIGS. 4A-4D may be used in forming the emitter region for both lateral bipolar transistors 200 of FIG. 2 and vertical bipolar transistors 300 of FIG. 3.

Figure 5:
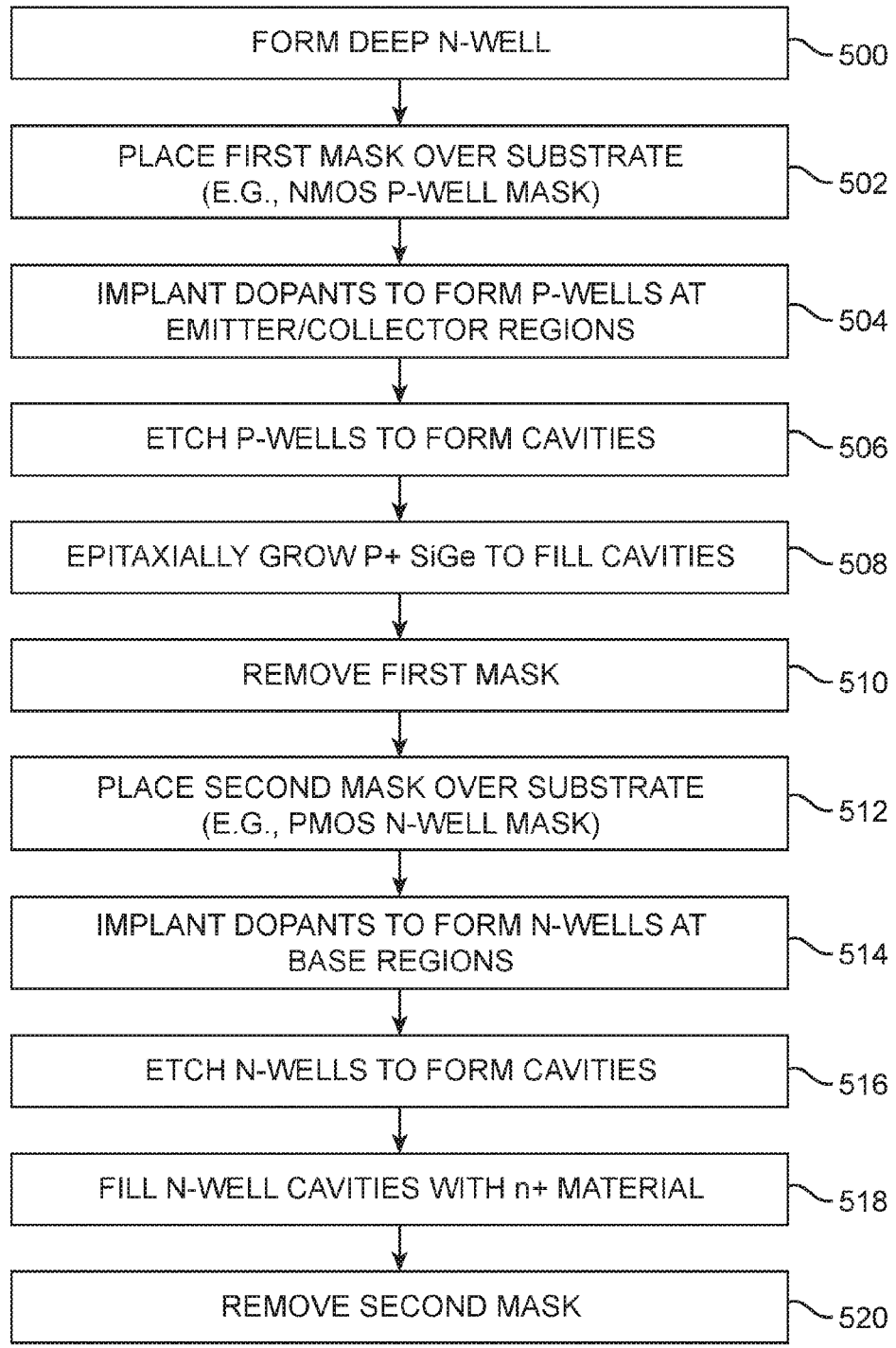
FIG. 5 is a flow chart of illustrative steps for forming a PNP bipolar transistor in accordance with an embodiment of the present invention.

FIG. 5 is a flow chart of illustrative steps involved in forming a PNP bipolar junction transistor in accordance with an embodiment of the present invention. At step 500, a deep N-well may be formed in a P-type substrate. The deep N-well may extend across an entire footprint of the transistor (when forming a lateral PNP transistor of the type shown in FIG. 2) or may extend across only a portion of the entire footprint of the transistor (when forming a vertical PNP transistor of the type shown in FIG. 3).

At step 502, a first mask (e.g., a mask that is also used for forming P-wells for NMOS transistors) may be placed over the substrate. While the first mask is positioned over the substrate, P-type dopants may be selectively implanted into the substrate to form P-wells at the emitter and collector regions (step 504).

At step 506, a cavity may be formed in each respective emitter/collector P-well region using etching operations (as described in connection with FIG. 4B). At step 508, P+ doped material such as P+ doped silicon germanium may be epitaxially grown within the etched cavities to form P+ well tap regions (e.g., in situ doping techniques may be performed to fill the etched cavities with P+ doped material). At step 510, the first mask may be removed from above the substrate. If desired, the first mask may be immediately removed after step 504.

At step 512, a second mask that is different from the first mask (e.g., a mask that is also used for forming N-wells for PMOS transistors) may be placed over the substrate. While the second mask is placed over the substrate, N-type dopants may be selectively implanted into the substrate to form N-wells at the base regions (step 514).

At step 516, a cavity may be formed in each respective base N-well region using etching operations. At step 518, N+ doped material may be formed within the etched N-well cavities to form N+ well taps (sometimes referred to as NTAPs). At step 520, the second mask may be removed from above the substrate. If desired, the second mask may be immediately removed after step 514. If desired, the N-wells may be formed before the P-wells (i.e., steps 512, 514, 516, 518, and 520 may be performed after step 500 and before step 502). Other manufacturing steps such as formation of emitter/base/collector contacts and interconnect signal routing paths in a dielectric stack on the surface of the substrate are not shown but may also be performed when fabricating an integrated circuit having CMOS circuitry and bipolar circuitry of the type described herein.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   a substrate;
   a PNP bipolar junction transistor that includes a p-type emitter region formed in the substrate, an n-type base region, and a p-type collector region, wherein the n-type base region comprises a ring-shaped base region that surrounds the p-type emitter region;
   an epitaxial p+ well tap region that is formed in the p-type emitter well region and that reduces transistor variation; and
   a deep n-well that is formed beneath the emitter region in the substrate.

2. The integrated circuit defined in claim 1, wherein the deep n-well extends only partially beneath the n-type base region.

3. The integrated circuit defined in claim 1, wherein the deep n-well further extends beneath the n-type base region and the p-type collector region.

4. The integrated circuit defined in claim 1, further comprising:
   a well tap formed in the base region, wherein the well tap serves as a base terminal for the PNP bipolar junction transistor.

5. The integrated circuit defined in claim 1, wherein the p-type collector region comprises a ring-shaped collector region that surrounds the n-type base region.

6. A bipolar junction transistor formed in an integrated circuit substrate, comprising:
   an emitter well region of a first doping type formed in the substrate;
   a base well region of a second doping type formed adjacent to the emitter well region in the substrate; and
   an epitaxial well tap region formed in the emitter well region to reduce transistor variation, wherein the well tap region and the emitter well region have the same doping type.

7. The bipolar junction transistor defined in claim 6, wherein the emitter well region comprises a P-well region.

8. The bipolar junction transistor defined in claim 6, wherein the emitter well region has a first doping concentration, and wherein the well tap region has a second doping concentration that is greater than the first doping concentration.

9. The bipolar junction transistor defined in claim 6, further comprising:
   a doped well region formed directly below the emitter well region, wherein the emitter well region and the doped well region have opposite doping types.

10. The bipolar junction transistor defined in claim 9, wherein the base well region laterally surrounds the emitter well region, and wherein the doped well region overlaps at least partly with the base well region.

11. A transistor, comprising:
    an emitter well that is formed from a substrate material having a first doping type and a given dopant concentration;

a base well that is formed from the substrate material having a second doping type that is different than the first doping type, wherein the base well directly contacts the emitter well and is laterally adjacent to the emitter well;

a well tap formed in the emitter well, wherein the well tap is formed from a different material than the substrate material, wherein the well tap directly contacts the substrate material in the emitter well having the given dopant concentration, and wherein the emitter well and base well are biased to different voltage levels; and a deep well of the second doping type that is formed directly below the emitter well and that is in physical contact with the emitter well.

12. The transistor defined in claim 11, wherein the deep well extends only partially below the base well.

13. The transistor defined in claim 11, wherein the deep well extends completely below the base well.

14. The transistor defined in claim 11, wherein the emitter well comprises a p-doped well, and wherein the base well comprises an n-doped well.

15. The transistor defined in claim 11, wherein the base well surrounds the emitter well.

16. The transistor defined in claim 11, further comprising:

a collector well that is formed from the substrate material having the first doping type and the given dopant concentration, wherein the base well is operable to electrically isolate the collector well from the emitter well; and an additional well tap formed in the collector well, wherein the additional well tap is formed from a different material than the substrate material, and wherein the additional well tap directly contacts the substrate material in the collector well having the given dopant concentration.

17. The transistor defined in claim 11, wherein the substrate material comprises silicon, and wherein the different material from which the well tap is formed comprises silicon germanium.

* * * * *